(12) United States Patent
Vornbrock et al.

(10) Patent No.: US 9,685,568 B2
(45) Date of Patent: Jun. 20, 2017

(54) PHOTOVOLTAIC MODULE WITH FLEXIBLE CIRCUIT

(71) Applicant: Merlin Solar Technologies, Inc., San Jose, CA (US)

(72) Inventors: Alejandro de la Fuente Vornbrock, San Carlos, CA (US); Arthur Rudin, Morgan Hill, CA (US); David Tanner, San Jose, CA (US)

(73) Assignee: Merlin Solar Technologies, Inc., San Jose, CA (US)

( * ) Notice: Subject to any disclaimer, the term of this patent is extended or adjusted under 35 U.S.C. 154(b) by 64 days.

(21) Appl. No.: 14/636,864

(22) Filed: Mar. 3, 2015

(65) Prior Publication Data

US 2015/0263182 A1    Sep. 17, 2015

Related U.S. Application Data

(60) Provisional application No. 61/952,040, filed on Mar. 12, 2014.

(51) Int. Cl.
*H01L 31/18*    (2006.01)
*H02S 40/34*    (2014.01)
(Continued)

(52) U.S. Cl.
CPC .... *H01L 31/0201* (2013.01); *H01L 31/02013* (2013.01); *H01L 31/042* (2013.01);
(Continued)

(58) Field of Classification Search
CPC ..... H01L 31/02; H01L 31/18; H01L 31/0201; H01L 31/02013; H01L 31/042; H01L 31/048; H01L 31/0504; H02S 40/34
(Continued)

(56) References Cited

U.S. PATENT DOCUMENTS 3,442,007 A * 5/1969 Humrick ......... H01L 31/022425
                                                        136/256
4,574,160 A    3/1986 Cull et al.
(Continued)

FOREIGN PATENT DOCUMENTS

WO    2008076301 A1    6/2008
WO    2010019754 A2    2/2010
(Continued)

OTHER PUBLICATIONS

International Search Report and Written Opinion dated May 28, 2015 for PCT Patent Application No. PCT/US2015/018415.

*Primary Examiner* — Matthew Martin
(74) *Attorney, Agent, or Firm* — The Mueller Law Office, P.C.

(57) ABSTRACT

A photovoltaic module, and method of making, is disclosed in which a flexible circuit is electrically coupled to a plurality of photovoltaic cells, where the photovoltaic cells are electrically coupled in series to form a series of cells. Each photovoltaic cell has free-standing metallic articles coupled to the top and bottom surfaces of a semiconductor substrate. A cell interconnection element of each photovoltaic cell is electrically coupled to a free-standing metallic article of an adjacent photovoltaic cell, where the interconnection elements of the initial and final cells in the series serve as contact ends for the series of cells. Contact tabs of the flexible circuit are electrically coupled to the contact ends of the series of cells, and a junction box is electrically coupled to a junction box contact region of the flexible circuit.

16 Claims, 9 Drawing Sheets

(51) Int. Cl.
  *H01L 31/02* (2006.01)
  *H01L 31/042* (2014.01)
  *H01L 31/048* (2014.01)
  *H01L 31/05* (2014.01)

(52) U.S. Cl.
  CPC ........ *H01L 31/048* (2013.01); *H01L 31/0504* (2013.01); *H01L 31/18* (2013.01); *H02S 40/34* (2014.12)

(58) Field of Classification Search
  USPC ............................................ 136/244; 438/67
  See application file for complete search history.

(56) References Cited

U.S. PATENT DOCUMENTS

| | | | |
|---|---|---|---|
| 4,695,674 A * | 9/1987 | Bar-on | H01L 31/022433 136/256 |
| 5,021,099 A | 6/1991 | Kim et al. | |
| 5,620,528 A | 4/1997 | Schade et al. | |
| 6,870,087 B1 | 3/2005 | Gallagher | |
| 7,759,158 B2 | 7/2010 | Bachrach et al. | |
| 7,812,247 B2 | 10/2010 | Armstrong et al. | |
| 8,697,980 B2 | 4/2014 | Paulson et al. | |
| 2002/0166580 A1 | 11/2002 | Bauman et al. | |
| 2004/0115536 A1* | 6/2004 | Blankenborg | C25D 1/04 429/245 |
| 2008/0314432 A1 | 12/2008 | Paulson et al. | |
| 2010/0000602 A1 | 1/2010 | Gray et al. | |
| 2010/0012172 A1 | 1/2010 | Meakin et al. | |
| 2010/0084003 A1 | 4/2010 | Chen | |
| 2010/0275976 A1* | 11/2010 | Rubin | H01L 31/02008 136/251 |
| 2011/0019349 A1 | 1/2011 | Pfeffer | |
| 2011/0155203 A1 | 6/2011 | Funakoshi | |
| 2012/0060919 A1* | 3/2012 | Mills | H01R 13/6641 136/259 |
| 2013/0048046 A1 | 2/2013 | Domsic et al. | |
| 2013/0112233 A1 | 5/2013 | Coakley | |

FOREIGN PATENT DOCUMENTS

| | | |
|---|---|---|
| WO | 2010057216 A2 | 5/2010 |
| WO | 2011139648 A2 | 11/2011 |
| WO | 2012161580 A1 | 11/2012 |

* cited by examiner

FIG. 1
U.S. Patent Application No. 13/798,123

FIG. 2
U.S. Patent Application No. 14/079,540

FIG. 3
U.S. Patent Application No. 14/079,540

FIG. 4
U.S. Patent Application No. 14/079,540

PHOTOVOLTAIC MODULE WITH FLEXIBLE CIRCUIT

CROSS-REFERENCE TO RELATED APPLICATION

This application claims priority to U.S. Provisional Patent Application No. 61/952,040, filed on Mar. 12, 2014 and entitled "Photovoltaic Module with Flexible Circuit", which is incorporated herein by reference in its entirety.

BACKGROUND OF THE INVENTION

A solar cell is a device that converts photons into electrical energy. The electrical energy produced by the cell is collected through electrical contacts coupled to the semiconductor material, and is routed through interconnections with other photovoltaic cells to form a photovoltaic module. The interconnections conventionally involve stringing cells together in series or parallel with ribbon bus bars, using two or three ribbons per cell. Automated methods for assembling photovoltaic modules have been developed to improve manufacturability and cost, such as using rollable sheets of solar cells, cell stringing machines and automated lamination. The cell strings are then connected to one or more junction boxes for the entire module using final ribbon runs. The final ribbon connections from the cells to the junction box are typically cut and soldered by hand.

A photovoltaic module also includes one or more bypass diodes to protect the module when cells within the module are not operating properly, such as due to damage or shading. A shaded cell reverse biases and consequently draws current from the module instead of producing current, which can result in electrical arcing and even fire, or hot spotting as referred to in the industry. In typical modules, one diode is required for a certain number of cells, such as approximately for every 18-24 solar cells. These diode connections add to the manufacturing steps that are required for assembling a photovoltaic module. Thus, numerous ribbon soldering steps and bypass diode connections are involved in fabricating a photovoltaic module, especially for large modules such as with sixty or more solar cells.

SUMMARY OF THE INVENTION

A photovoltaic module, and method of making, is disclosed in which a flexible circuit is electrically coupled to a plurality of photovoltaic cells, where the photovoltaic cells are electrically coupled in series to form a series of cells. Each photovoltaic cell has free-standing metallic articles coupled to the top and bottom surfaces of a semiconductor substrate. A cell interconnection element of each photovoltaic cell is electrically coupled to a free-standing metallic article of an adjacent photovoltaic cell, where the interconnection elements of the initial and final cells in the series serve as contact ends for the series of cells. Contact tabs of the flexible circuit are electrically coupled to the contact ends of the series of cells, and a junction box is electrically coupled to a junction box contact region of the flexible circuit.

BRIEF DESCRIPTION OF THE DRAWINGS

Each of the aspects and embodiments of the invention described herein can be used alone or in combination with one another. The aspects and embodiments will now be described with reference to the attached drawings.

DETAILED DESCRIPTION OF THE EMBODIMENTS

In the present disclosure, a photovoltaic module utilizes a flexible circuit for module-level junctions, with solar cells that incorporate free-standing metallic articles. The photovoltaic cells have interconnection elements that are used to form series connections between cells, and to a junction box using the flexible circuit. The flexible circuit can also include diode connections, such that the diode can be housed in the junction box, away from the cells. The flexible circuit reduces the number of terminals that must be soldered compared to ribbon bus bars of conventional cells, making fabrication of the photovoltaic module easily adaptable to automated processes.

Babayan et al., U.S. patent application Ser. No. 13/798,123, entitled "Free-Standing Metallic Article for Semiconductors" and filed on Mar. 13, 2013, and Babayan et al., U.S. Pat. No. 8,569,096, entitled "Free-Standing Metallic Article for Semiconductors" and issued on Oct. 29, 2013—both of which are owned by the assignee of the present application and are hereby incorporated by reference—disclose electrical conduits for semiconductors such as photovoltaic cells that are fabricated as an electroformed free-standing metallic article. The metallic articles are produced separately from a solar cell and can include multiple elements such as fingers and bus bars that can be transferred stably as a unitary piece and easily aligned to a semiconductor device. The elements of the metallic article are formed integrally with each other in the electroforming process. The metallic article is manufactured in an electroforming mandrel, which generates a patterned metal layer that is tailored for a solar cell or other semiconductor device. For example, the metallic article may have grid lines with height-to-width aspect ratios that minimize shading for a solar cell. The metallic article can replace conventional bus bar metallization and ribbon stringing for cell metallization, cell-to-cell interconnection and module making The ability to produce the metallization layer for a photovoltaic cell as an independent component that can be stably transferred between processing steps provides various advantages in material costs and manufacturing.

Figure 1:
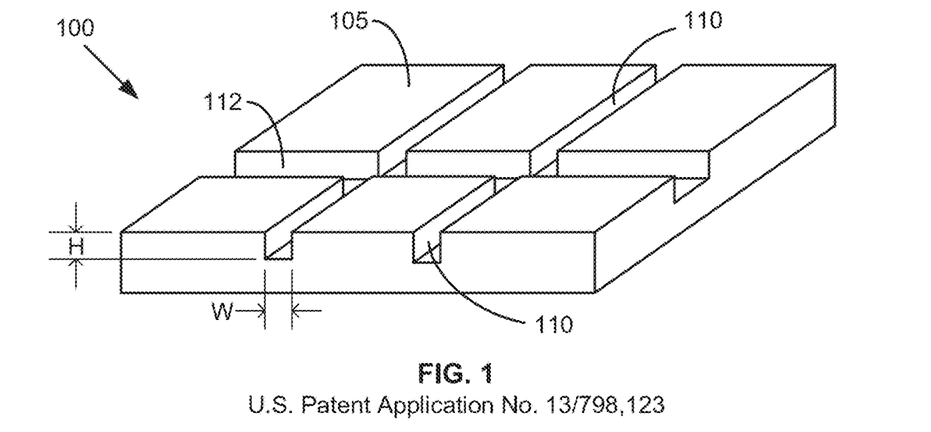
FIG. 1 shows a perspective view of an exemplary electroforming mandrel as disclosed in U.S. patent application Ser. No. 13/798,123.

FIG. 1 depicts a perspective view of a portion of an exemplary electroforming mandrel 100 in one embodiment of U.S. patent application Ser. No. 13/798,123. The mandrel 100 may be made of electrically conductive material such stainless steel, copper, anodized aluminum, titanium, or molybdenum, nickel, nickel-iron alloy (e.g., Invar), copper, or any combinations of these metals, and may be designed with sufficient area to allow for high plating currents and enable high throughput. The mandrel 100 has an outer surface 105 with a preformed pattern that comprises pattern elements 110 and 112 and can be customized for a desired shape of the electrical conduit element to be produced. In this embodiment, the pattern elements 110 and 112 are grooves or trenches with a rectangular cross-section, although in other embodiments, the pattern elements 110 and 112 may have other cross-sectional shapes. The pattern elements 110 and 112 are depicted as intersecting segments to form a grid-type pattern, in which sets of parallel lines intersect perpendicularly to each other in this embodiment.

The pattern elements 110 have a height 'H' and width 'W', where the height-to-width ratio defines an aspect ratio. By using the pattern elements 110 and 112 in the mandrel 100 to form a metallic article, the electroformed metallic parts can be tailored for photovoltaic applications. For example, the aspect ratio may be between about 0.01 and about 10 as desired, to meet shading constraints of a solar cell.

The aspect ratio, as well as the cross-sectional shape and longitudinal layout of the pattern elements, may be designed to meet desired specifications such as electrical current capacity, series resistance, shading losses, and cell layout. Any electroforming process can be used. For example, the metallic article may be formed by an electroplating process. In particular, because electroplating is generally an isotropic process, confining the electroplating with a pattern mandrel to customize the shape of the parts is a significant improvement for maximizing efficiency. Furthermore, although certain cross-sectional shapes may be unstable when placing them on a semiconductor surface, the customized patterns that may be produced through the use of a mandrel allows for features such as interconnecting lines to provide stability for these conduits. In some embodiments, for example, the preformed patterns may be configured as a continuous grid with intersecting lines. This configuration not only provides mechanical stability to the plurality of electroformed elements that form the grid, but also enables a low series resistance since the current is spread over more conduits. A grid-type structure can also increase the robustness of a cell. For example, if some portion of the grid becomes broken or non-functional, the electrical current can flow around the broken area due to the presence of the grid pattern.

Figure 2:
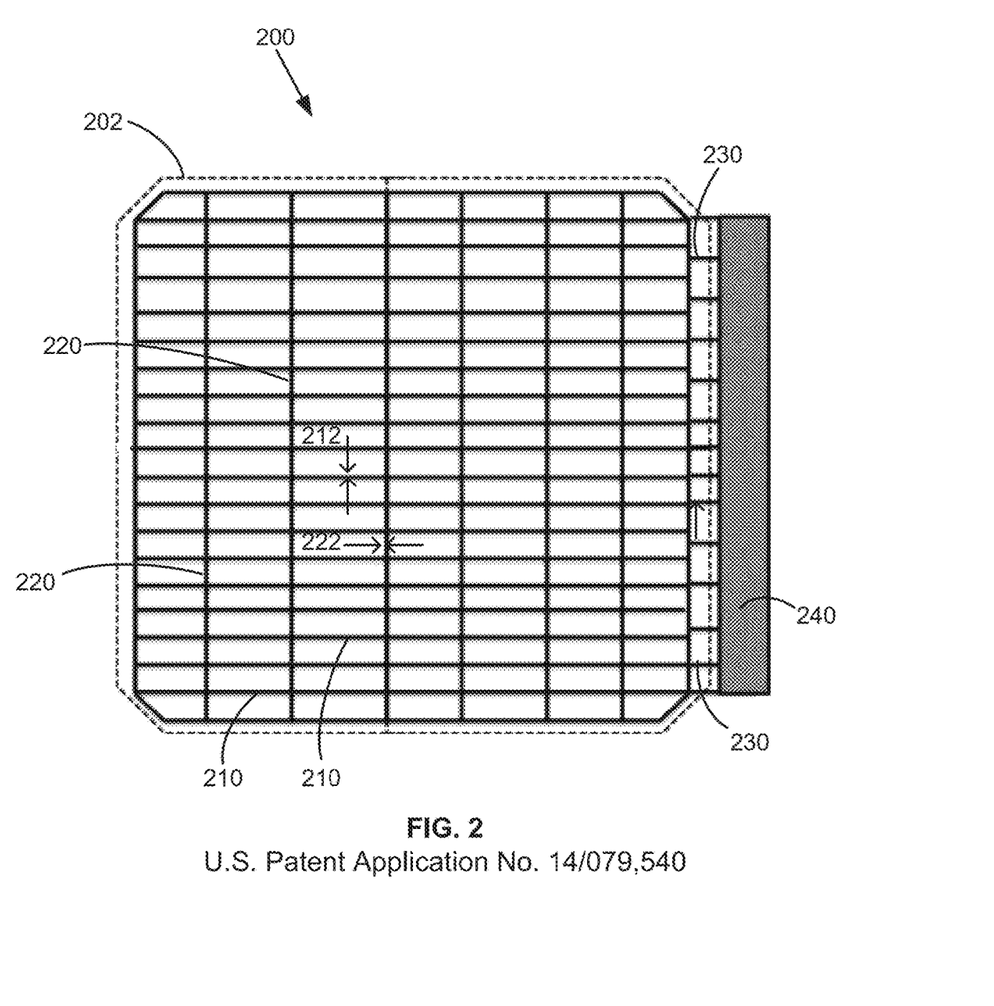
FIG. 2 provides a top view of a metallic article as disclosed in U.S. patent application Ser. No. 14/079,540.

FIG. 2 shows a top view of an exemplary metallic article 200 that may be produced with the electrically conductive mandrel of FIG. 1. The metallic article 200 of FIG. 2 is disclosed in Babayan et al., U.S. patent application Ser. No. 14/079,540, entitled "Adaptable Free-Standing Metallic Article For Semiconductors" and filed on Nov. 13, 2013; which is owned by the assignee of the present disclosure and is hereby incorporated by reference. The metallic article 200 shows embodiments of various features adapted for a photovoltaic cell. A semiconductor substrate 202 is shown in dashed lines to demonstrate the placement of metallic article on a photovoltaic cell, where the metallic article 200 is configured here as a grid for the front side of the cell. However, the features described herein may be applied to an electrical conduit for the back side of a photovoltaic cell. In this disclosure, reference to semiconductor materials in formation of a semiconductor device or photovoltaic cell may include amorphous silicon, crystalline silicon or any other semiconductor material suitable for use in a photovoltaic cell. The metallic articles may be also applied to other types of semiconductor devices other than photovoltaic cells. Semiconductor substrate 202 is shown in FIG. 2 as a mono-crystalline cell with rounded corners, also referred to as a pseudosquare shape. In other embodiments, the semiconductor substrate may be multi-crystalline, with a fully square shape. Semiconductor substrate 202 may have electrical conduit lines (not shown) on its surface, such as silver fingers, that carry current generated by substrate 202. The silver fingers may be screen-printed onto the semiconductor substrate 202 according to conventional methods. For example, the silver fingers may be lines that are perpendicular to the direction of grid lines 210. The elements of metallic article 200 then serve as electrical conduits to carry electrical current from the silver fingers. In this embodiment of FIG. 2, grid lines 210 (horizontal in FIGS. 2) and 220 (vertical in FIG. 2) of metallic article 200 are electrically coupled to the semiconductor substrate 202, such as by soldering, to collect and deliver the current to interconnection elements 230 and 240. Interconnection elements 230 and 240 enable cell-to-cell connections for a solar module. Fabricating metallic article 200 with a metal such as copper reduces the cost compared to a cell in which silver is used for all the electrical conduits, and can also improve cell efficiency due to improved conductivity.

The gridline lines 210 and 220 of FIG. 2 are shown as approximately perpendicular to each other; however, in other embodiments they may be at non-perpendicular angles to each other. Although both the gridline lines 210 and intersecting gridline lines 220 are capable of carrying electrical current, gridline lines 210 provide the path of least resistance to interconnection elements 230 and 240 and would function as the primary carriers of electrical current. Thus, in this disclosure gridline lines 210 shall also be referred to as bus bars, while the intersecting gridline lines 220 may be referred to as cross members or support members. Cross members 220 provide mechanical support for the free-standing metallic article 200, both in terms of strength and in maintaining dimensional specifications of the grid. However, cross members 220 can also serve as electrical conduits, such as in providing redundancy if a bus bar 210 should fail. In some embodiments, gridline lines 210 and 220 may have widths 212 and 222, respectively, that differ from each other such as to optimize mechanical strength or achieve a desired fill factor for the cell. For example, width 212 of gridline lines 210 may be smaller than width 222 of gridline lines 220, so that gridline lines 220 provide sufficient mechanical stability for metallic article 200 while gridline lines 210 are tailored to achieve as high a fill factor as possible. In other embodiments, width 212 of bus bars 210 may be greater than width 222 of the support members 220, to achieve the electrical capacity needed for a certain number of bus bars 210. In further embodiments, certain gridline lines 210 may have different widths than other gridline lines 210, such as to address mechanical strength or electrical capacity of a particular zone. The pitch of bus bars 210 may also vary from the cross members 220, or may vary from each other in different regions within metallic article 200 to meet required device conduction requirements. In some embodiments, a coarser or finer mesh pitch may be chosen based on, for example, the silver finger designs of the wafer, the precision of the silver screen printing process, or the type of cell being used.

Other free-standing, unitary metallic articles that may be used with the present disclosure have overplated portions, as disclosed in U.S. patent application Ser. No. 14/139,705, entitled "Free-Standing Metallic Article With Overplating" and filed on Dec. 23, 2013; which is owned by the assignee of the present disclosure and is hereby incorporated by reference. Yet further metallic articles may incorporate expansion segments, as disclosed in U.S. patent application Ser. No. 14/079,544, entitled "Free-Standing Metallic Article With Expansion Segment" and filed on Nov. 13, 2013; which is owned by the assignee of the present disclosure and is hereby incorporated by reference.

Figure 3:
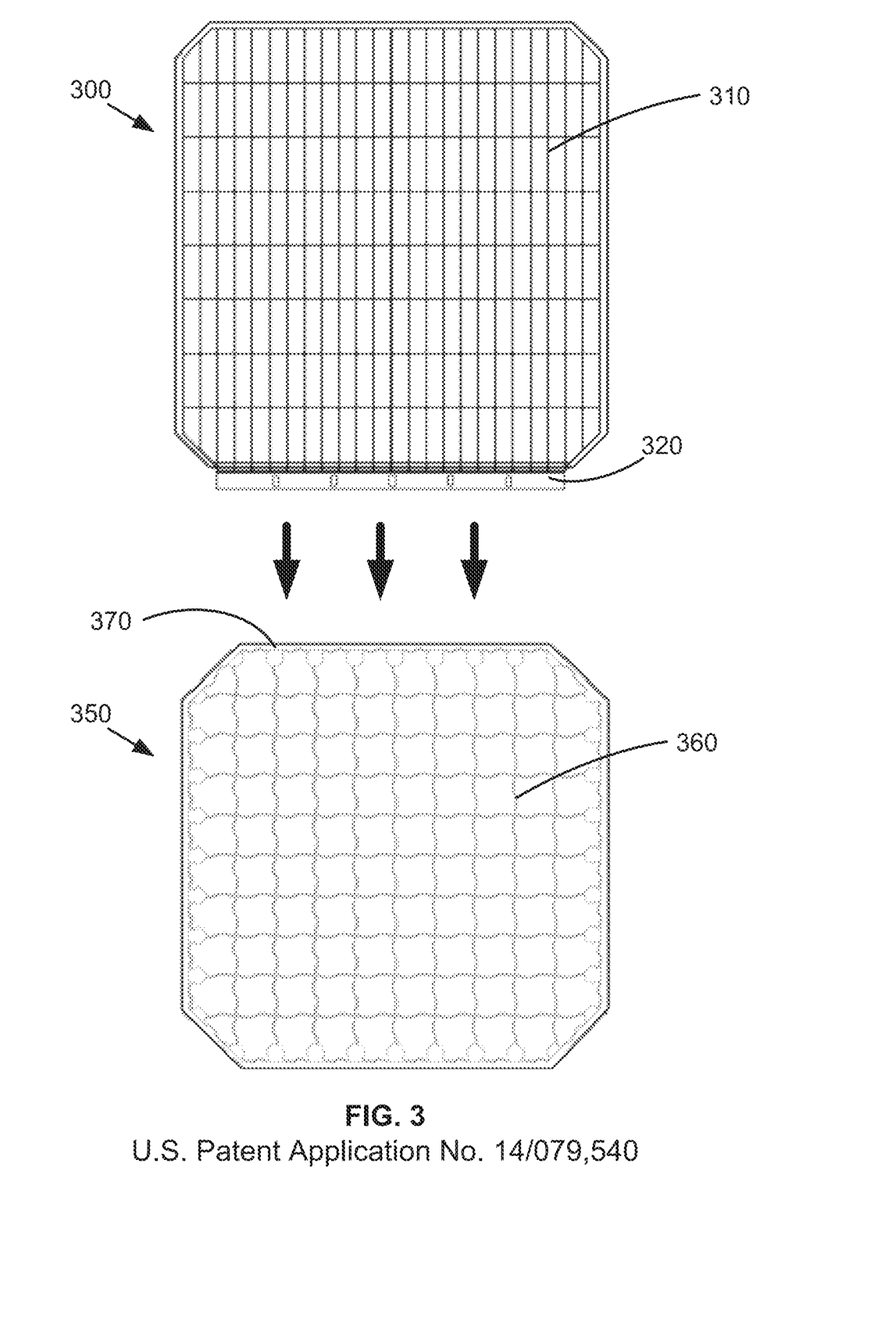
FIG. 3 illustrates a cell-to-cell interconnection between an exemplary front mesh and back mesh as disclosed in U.S. patent application Ser. No. 14/079,540.

FIG. 3 shows a top view of an exemplary front-to-back cell-to-cell interconnection between two photovoltaic cells as disclosed in U.S. patent application Ser. No. 14/079,540. Cell 300 has a metallic article 310 mounted on the front side, where the metallic article 310 includes an interconnect element 320 at one edge. Metallic article 310 may be, for example, the metallic grid of FIG. 2 or of the related applications incorporated by reference above. Interconnect 320 is joined to the back side of cell 350, which has a metallic article 360 configured as a back side mesh. The joining may be achieved by, for example, soldering, welding, ultrasonic, conductive adhesive, or other electrical bonding methods. The interconnect 320 is bonded to the bus bar 370 of metallic article 360 for a series connection between cells 300 and 350. The interconnect 320 may be integrally formed with the gridlines of the metallic article 310, or may be a separate piece that is joined to the grid. In certain embodiments, the interconnection elements may extend beyond the edge of the photovoltaic cell such that there is spacing and consequently flexure that is enabled between cells. In some embodiments, both the front metallic article 310 and the back metallic article 360 may have cell-to-cell interconnection elements, such as interconnect 320. In further embodiments, the back metallic article 360 may have an interconnection element while the front metallic article 310 does not. Interconnection element 320 in this embodiment spans substantially an entire edge of metallic article 310, such that it is coupled to the plurality of gridlines of the metallic article 310. Thus, one solder joint with the cell interconnection element 320 enables electrical connection to the entire cell in which the metallic article is used. The interconnection element 320 may or may not extend beyond the top or bottom surface of the semiconductor substrate of a photovoltaic cell, such as to allow for overlap with an adjacent cell, as well as to allow for easy connection to a flexible circuit as shall be described subsequently.

Figure 4:
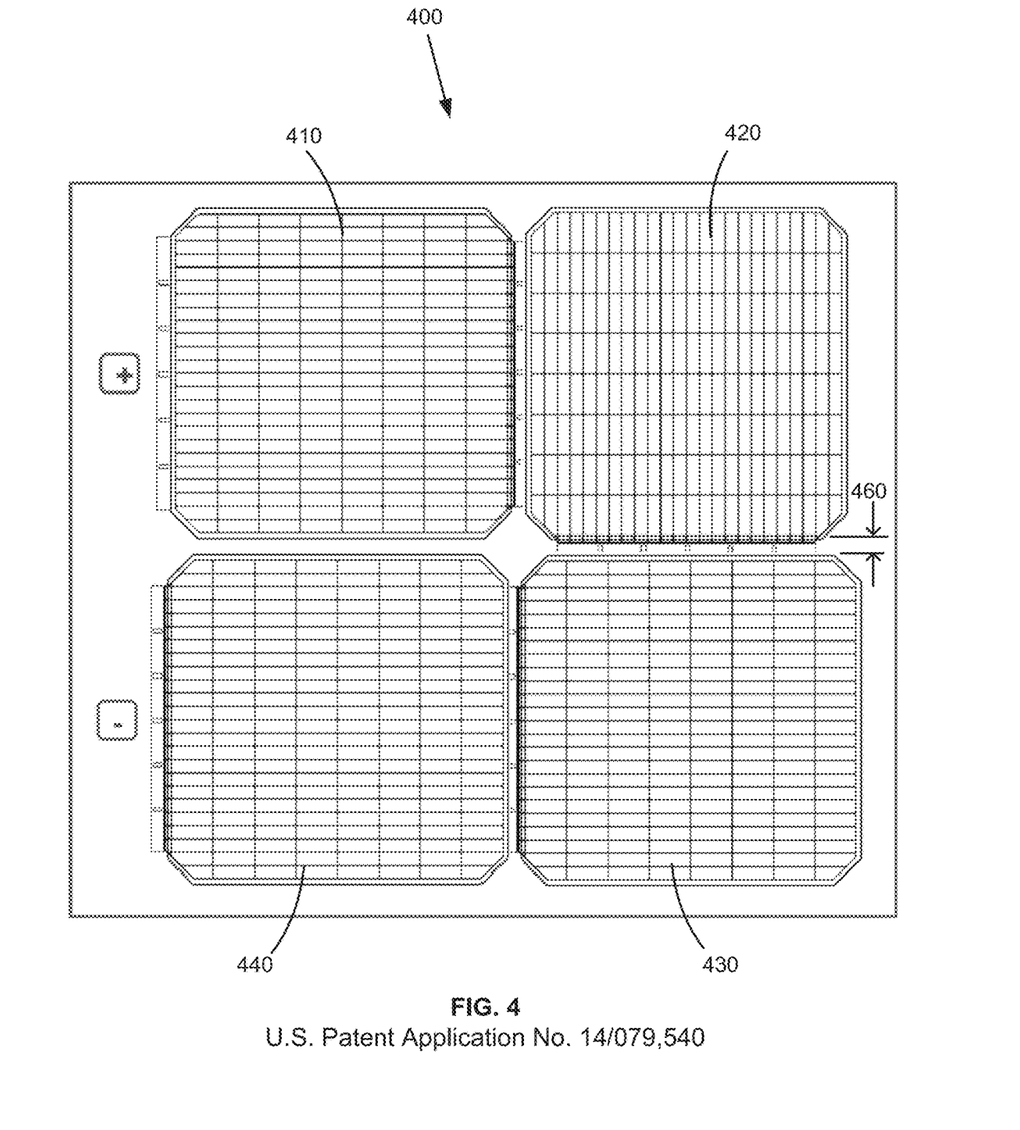
FIG. 4 shows exemplary photovoltaic cells with metallic articles, forming a module assembly.

FIG. 4 illustrates a top view of an assembly 400 of photovoltaic cells 410, 420, 430 and 440 in one embodiment, as would be assembled for a module. Four cells are shown in FIG. 4, although any number of cells—such as 4 to 100, or 36 to 96, or 36 to 60—may be utilized in a module as desired. Each neighboring pair of cells is joined together as described in relation to FIG. 3. However, in the embodiment of FIG. 4 each adjacent cell is rotated 90° from the previous cell. For example, cell 420 is rotated 90° clockwise from cell 410 to connect to cell 430, and cell 430 is rotated 90° clockwise from cell 420 to connect to cell 440. The cells are connected in series, with a front metallic article of one cell being coupled to the back side metallic article of an adjacent cell as described in relation to FIG. 3. Cell 410 in FIG. 4 provides a positive terminal for the module 400, while cell 440 provides the negative terminal. Thus, the mesh designs of the metallic articles described herein can be configured with a symmetry that allows for various orientations on a cell, enabling cells within a module to be connected in any sequence as desired. The cells 410, 420, 430 and 440 are assembled with a gap 460 between them, which allows for flexure of the overall module and also assists with the flow of laminating material when encapsulating the finished module.

Figure 5:
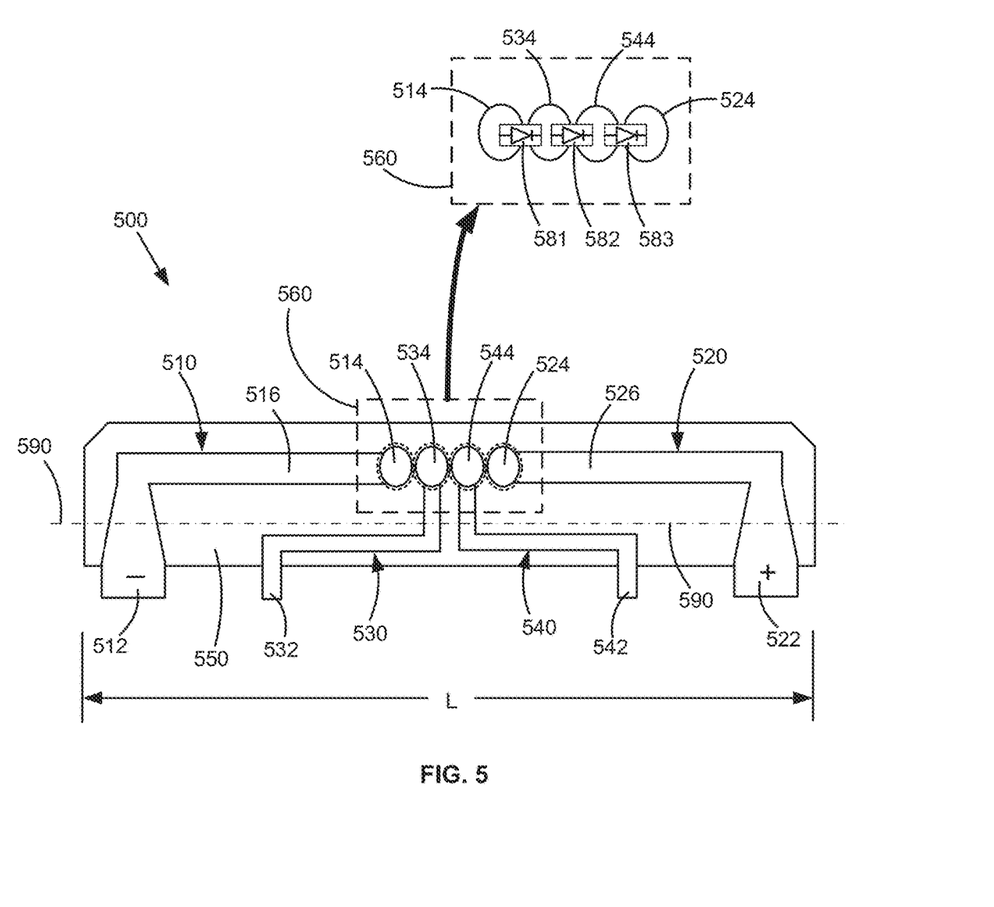
FIG. 5 is a top view of a flexible circuit for a photovoltaic module, in one embodiment.

FIG. 5 shows a top view of an exemplary embodiment of a flexible circuit 500 for use with a module having free-standing metallic articles, such as in FIG. 4. Note that the dimensions shown in FIG. 5 are not to scale, for clarity of the components. Flexible circuit 500 has a first electrical conduit 510, a second electrical conduit 520, a third electrical conduit 530 and a fourth electrical conduit 540, all mounted on a support sheet 550. Support sheet encompasses the entire length of flexible circuit 500 in this embodiment, and most of its width. Support sheet 550 is an insulating dielectric layer, such as a polymer. The polymer may be, for example, a polyester such as polyethylene terephthalate (PET), or a polyimide. Other low-cost polymers known for use in solar modules may also be utilized. First conduit 510 has a first contact tab 512 that provides a connection to an initial end of a series of cells, and is shown as a negative terminal in this embodiment. Similarly, second conduit 520 has a second contact tab 522 that provides a connection to a final end of a series of cells, shown as a positive terminal in this embodiment. Third and fourth conduits 530 and 540 have third and fourth contact tabs 532 and 542, respectively, that allow for connection to the series of cells. At least a portion of the conduits 510, 520, 530 and 540 are attached to the support sheet 550, where portions of the conduits that are extend beyond the support sheet may be used for electrical connections. The conduits may be attached to support sheet 550 using, for example, adhesives. The flexible module 500 may include one support sheet 550 underneath the electrical conduits 510, 520, 530 and 540. In other embodiments support sheets 550 may be both underneath and overlying the conduits, such that the conduits 510, 520, 530 and 540 are sandwiched between the dielectric material. In such embodiments, a two separate pieces of support sheets 550 may be used, or alternatively, one support sheet 550 may be placed under the conduits and then folded over the conduits.

At the opposite ends of the tabs 512, 522, 532 and 542 of conduits 510, 520, 530 and 540 are junction box contact pads 514, 524, 534 and 544, respectively, which are grouped together in junction box contact region 560 to enable junction box connections for the overall module. The junction box contact pads 514, 524, 534 and 544 enable connection to bypass diodes. The flexible circuit 500 is configured with four conduits 510, 520, 530 and 540 for a module having six columns of cells, where a bypass diode, such as diode 581, may be connected between adjacent pads 514 and 534 for a first pair of cell strings. A second bypass diode 582 may be connected between adjacent pads 534 and 544 for another set of cell strings, and a third bypass diode 583 may be connected between adjacent pads 544 and 524 for a final set of cell strings. Diodes 581, 582 and 583 may be located in the junction box area, away from the photovoltaic cells, thus improving safety. Depending on the number of cell strings in a module, the flexible circuit 500 may have different numbers of electrical conduits. For example, a module with only two columns of cells (e.g., module 400 of FIG. 4) may only require two conduits in the flexible circuit 500, such as conduits 510 and 520, and may not require a diode. A module with a greater number of cell strings may incorporate more than four electrical conduits in the flexible circuit 500.

The junction box contact pads 514 and 524 allow for an output connection for the junction box, to deliver the current from the entire module. Thus, the flexible circuit 500 allows for a minimal number of solder points between the series of cells and the output for the junction box. In some embodiments, the flexible circuit 500 is designed with a high current capacity such that only one junction box is needed for an entire module, and the first and second contact pads 512 and 522 are the only junction points between the series of cells and the output connection of the junction box. In other embodiments the flexible circuit 500 may be folded over at line 590, which allows the electrical conduits of flexible circuit 500 to provide a large amount of surface area, for high current-carrying capability, while occupying less space on the overall module.

In this embodiment of FIG. 5, the junction box contact pads 514, 524, 534 and 544 are located between the first contact tab 512 and the second contact tab 522. That is, first contact pad 512, second contact pad 522, first junction box contact pad 514 and second junction box contact pad 524 are laterally spaced apart on the support sheet 550, with the first junction box contact pad 514 and the second junction box contact pad 524 being between the contact tabs 512 and 522. Thus, the contact tabs 512 and 522 are positioned with enough space between them to be easily laid onto the beginning and ending cells in a series, while the junction box pads 514 and 524 are positioned close together to facilitate junction box wiring. Junction box contact pads in this embodiment are configured as round or oval metal pads, which provide a large area for easy electrical connection. The pads 514, 524, 534 and 544 may be pre-cleaned, rather than needing to clean the solder connections after backing sheets and other module layers are assembled. Connector 516 of conduit 510 extends along the length of flexible circuit 500 between contact tab 512 and junction box contact pad 514, to serve as a conduit between tab 512 and pad 514. Similarly, connector 526 of conduit 520 extends along flexible circuit 500 between contact tab 522 and junction box contact pad 524. The dashed circles surrounding each contact pad 514, 524, 534 and 544 represent contact openings in the support sheet 550, to enable wiring access to the contact pads. Conduits 510, 520, 530 and 540 are strips of conductive metal, such as copper, and can be made by, for example electroforming, etching, or stamping. The conduits 510 and 520 may be designed with sufficient thickness and surface area to have a high electrical current capacity for an entire photovoltaic module. The current capacity for flexible circuit 500 may be, for example, 4-40 amperes, such as 8-12 amperes. In some embodiments the sheet thickness of conduits 510 and 520 may be, for example, 20-400 μm, such as 100-200 μm. The length 'L' of the flexible circuit 500 can be customized to span the edge of the photovoltaic module to which it is being attached. For example, 'L' may be on the order of 1 meter for a module of 60 cells.

Figure 6A:
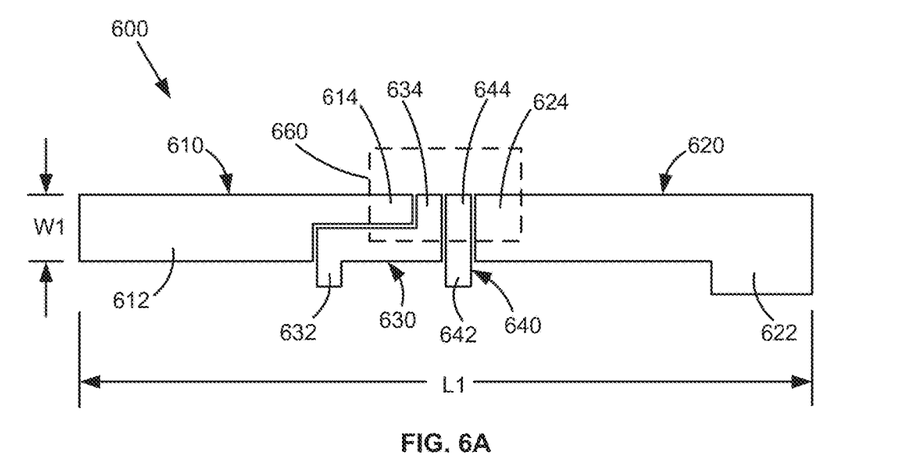
FIGS. 6A and 6B are top and bottom views, respectively, of another embodiment of a flexible circuit.
Figure 6B:
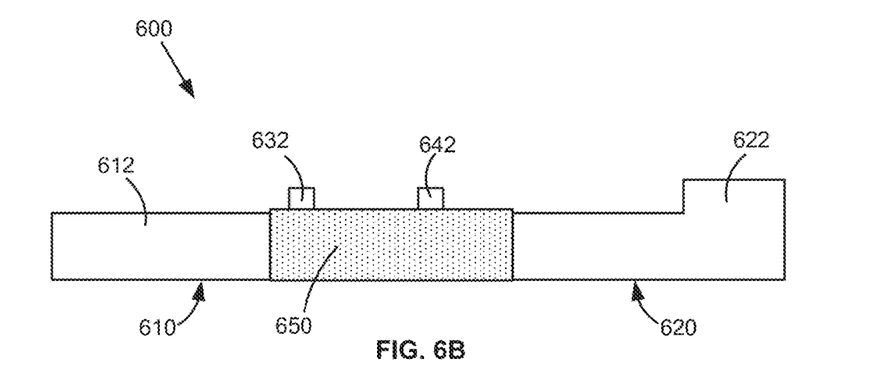

FIGS. 6A and 6B show top and bottom views, respectively, of another embodiment of a flexible circuit 600, that uses a smaller support sheet. Dimensions are not shown to scale proportionally, for clarity of the components. For example, the horizontal length 'L1' of flexible circuit 600 may be greatly extended relative to the width 'W1' shown in FIGS. 6A-6B. In one exemplary embodiment, the length 'L1' of flexible circuit 600 may be configured according to the size of a photovoltaic module, such as on the order of 0.3-2 meters, such as 1 meter, and a nominal width 'W1' on the order of 5-30 mm, such as 15-30 mm. Flexible circuit 600 includes four conductive pieces in this embodiment—a first electrical conduit 610, a second electrical conduit 620, a third electrical conduit 630 and a fourth electrical conduit 640. The conduits 610, 620, 630 and 640 are arranged side by side with isolating gaps between them. First conduit 610 has a contact tab 612 to enable electrical connection between a photovoltaic cell and a junction box contact pad 614 at the opposite end of the conduit 610. Similarly, second conduit 620 has a contact tab 622 at one end and a junction box contact pad 624 at the opposite end. Third and fourth conduits 630 and 640 have contact tabs 632 and 642, respectively, and junction box contact pads 634 and 644 at the opposite ends of the conduits. Junction box contact pads 614, 624, 634 and 644 are positioned near each other in a junction box contact region 660 and along one horizontal edge (top edge in FIG. 6A) of the flexible circuit 600. The contact tabs 612, 622, 632 and 642 are along an opposite horizontal edge (bottom edge in FIG. 6A) of the flexible circuit 600, for proximity to the photovoltaic cells to which they are to be coupled. In this embodiment, contact tab 612 is approximately flush with the edge of the flexible circuit 600, for photovoltaic cells that may have an interconnection that extends beyond the body of the cell (e.g., interconnect 320 of FIG. 3). Contact tab 620, however, has an L-shape such that contact tab 622 extends past the bottom edge of flexible circuit 600 in FIG. 6A. This type of extending tab may be used, for example, where the photovoltaic cell to which it is connecting does not have an extending interconnect. For example, tab 622 may be used to connect with the back side metallic article 360 of FIG. 3, which has flush edges. It can be seen that having a limited number of contact pads, such as only four junction box contact pads 614, 624, 634 and 644 in FIG. 6A, for making electrical connections for both the photovoltaic cells and bypass diodes of the entire module enables mechanical and electrical assembly that is easily automatable.

Conduits 610, 620, 630 and 640 are sheets of conductive material, such as copper, having sufficient thickness and surface area to accommodate the electrical current capacity of a photovoltaic module. For example, the sheet thickness of the conduits may be on the order of 20-400 μm, such as 250-350 μm, with a total length 'L1' of 300-2000 mm, such as 900-1000 mm, and a width 'W1' such as 25-35 mm for a module containing 36-60 cells. Conduits 610, 620, 630 and 640 may be formed by, for example, electroforming, etching or stamping.

FIG. 6B is a bottom view of the flexible circuit 600, showing a support sheet 650 covering a portion of the flexible circuit, rather than the entire circuit as with support sheet 550 of FIG. 5. Support sheet 650 is an insulating dielectric layer, such as polyethylene terephthalate (PET) or other polyester, or may be a polyimide. For example, support sheet 650 may be PET or polyimide with a thickness of approximately 50 μm. In the embodiment of FIG. 6B, the support sheet 650 is attached to portions of the first and second conduits 610 and 620 in the junction box contact region (660 of FIG. 6A), enabling the contact tabs 612, 622, 632 and 642 to remain exposed for soldering to photovoltaic cells. In other embodiments, the support sheet 650 can extend horizontally further than shown, beyond the junction box contact region 660, as long as the contact tabs 612 and 622 remain uncovered or exposed through apertures (not shown) cut in the support sheet 650 to allow for electrical connections to be made. Support sheet 650 may be on one face of the flexible circuit 600, such as the bottom side as shown, or may be on both top and bottom faces of the flexible circuit 600 with apertures cut in the support sheet 650 to enable connections for junction box contact pads 614, 624, 634 and 644. In one method of manufacturing the flexible circuit 600, the conduits 610, 620, 630 and 640 may be patterned into a single sheet of metal, where multiple sets of the conduits may be laid out on a sheet in some embodiments. Then the support sheet 650 may be glued onto the conduits while the traces (patterns for conduits 610, 620, 630 and 640) are still mechanically connected. The conduit pieces are then separated from each other, with the support sheet 650 maintaining the positioning between the conduit pieces. The support sheet 650 thus may also be used as a manufacturing aid such that the conduit pieces need not be handled separately.

Figure 7:
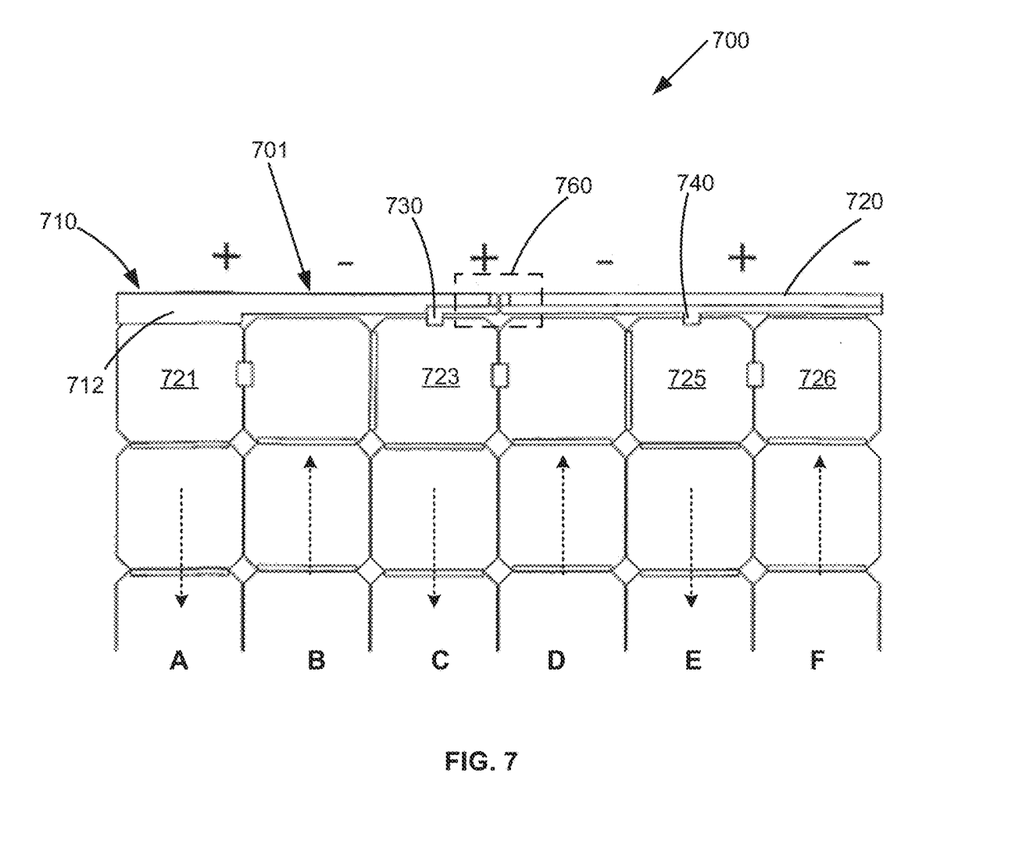
FIG. 7 depicts an embodiment of a flexible circuit assembled with a photovoltaic module.

FIG. 7 shows bottom view of a portion of an exemplary module 700 that includes a flexible circuit 701 similar to the flexible circuit 600 of FIGS. 6A-6B. Module 700 has six columns of photovoltaic cells A, B, C, D, E and F in this embodiment, where the cells are connected in series as described in relation to FIGS. 3 and 4. The dashed-line arrows indicate the serial routing, such as through front-to-back interconnections between cells using metallic articles as described in FIGS. 3 and 4, with positive '+' and negative '−' connections as shown at the top of FIG. 7. In other embodiments, conventional cells with ribbon stringing may be used with the flexible circuits of this disclosure. Initial cell 721 of column A is the first cell for the series of cells in the photovoltaic module 700, and final cell 726 is the last cell in the series. Note that because the electrical terminals provided by flexible circuit 710 are located on one edge of the module, the module 700 is arranged with an even number of cell columns, (six in this embodiment) so that both the positive and negative ends of the cell columns are on edge where the flexible circuit 701 is located.

Flexible circuit 701 has a first conduit 710 with a contact tab 712 that extends from flexible circuit 701 in this embodiment, to overlap an edge of cell 721 and be electrically coupled to, for example, a metallic article conductor on the back side of cell 721. In other embodiments, contact tab 712 may be coupled to bus bar ribbons of cell 721. Final cell 726 may be electrically coupled to second conduit 720 of flexible circuit 701 through, for example, an interconnection element (not shown) extending from the front side of cell 726, or through bus bar ribbons. The interconnection element of cell 726 may be the interconnection element strip 320 of FIG. 3, which enables one solder joint to electrically connect the flexible circuit 701 to cell 726 compared to multiple solder joints for multiple bus bar ribbons. Flexible circuit 701 also includes third conduit 730 that is electrically coupled to cell 723 of column C, and fourth conduit 740 that is electrically coupled to cell 725 of column E. Diodes (not shown) may be coupled between adjacent pairs of junction box pads at ends of conduits 710, 720, 730, and 740 in junction box region 760, similar to the diodes 581, 582 and 583 described in relation to FIG. 5.

For the module-level connections, it can be seen that only four attachment points—junction box contact pads of conduits 710, 720, 730 and 740 in junction box region 760—are required for coupling the cell strings and diodes of module 700 to a junction box. By having the four contact pads (not shown for clarity) grouped together in one area, junction box connections are simplified compared to having multiple ribbons that must be routed and threaded into the junction box area and soldered by hand. Regarding manufacturability, the flexible circuit 701 only needs to be laid into position on the module 700 and soldered onto the interconnection elements of cells 721, 723, 725 and 726, and therefore is conducive to automated processes. Flexible circuits are generally low cost components, which further reduces cost of the overall module. In some embodiments, the contact pads of conduits 710, 720, 730 and 740 can be large metal pads for easy access inside the junction box. Also, while conventional modules require the back sheet of a module to be cut (e.g., slitted) to allow for a junction box ribbon to be manually pushed through the back EVA and backsheet before lamination, the flexible circuits described herein allow for pre-punching holes in the back EVA and backsheet to expose the flexible circuit contact points for direct soldering or for welding the contact leads from the junction box.

Figure 8:
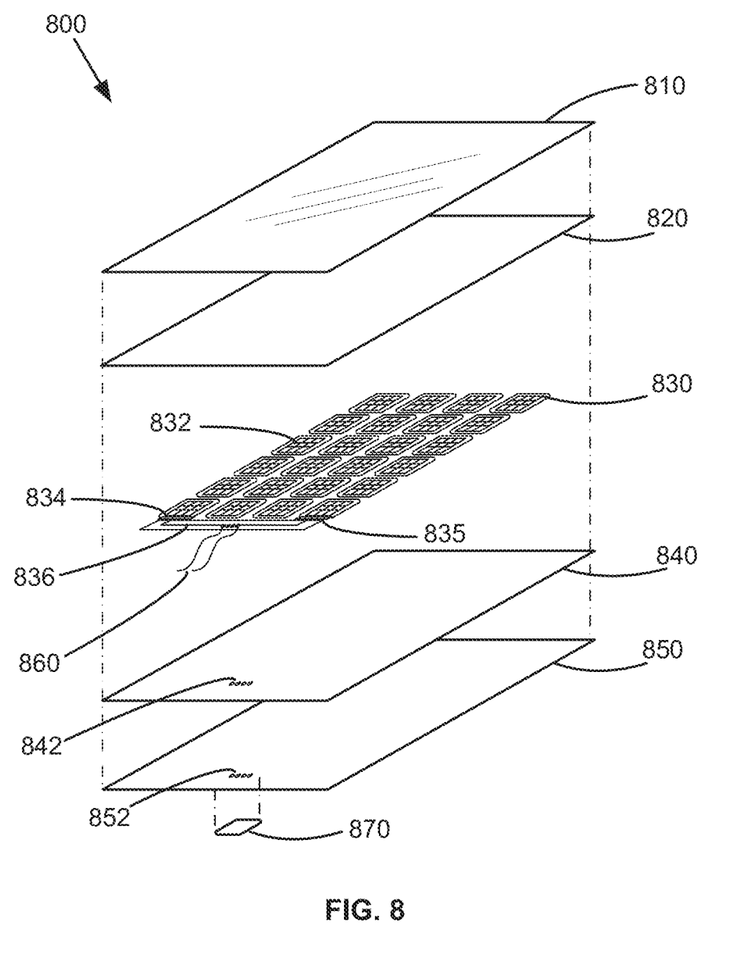
FIG. 8 is an exploded assembly view of a photovoltaic module with metallic articles and a flexible circuit.

FIG. 8 is an exploded assembly view of a photovoltaic module assembly 800 using the flexible circuits and solar cells with free-standing metallic articles as disclosed herein. A photovoltaic module layer 830 has photovoltaic cells 832 connected in series, with initial contact end 834 and final contact end 835 of the series of cells 832 being electrically coupled to flexible circuit 836. The photovoltaic cells 832, made with free-standing metallic articles, are assembled onto the module sheet 840, which may be a material such as ethylene vinyl acetate (EVA). The cells 832 may be laid into place and have interconnection elements coupled together to adjacent cells as described above, using manual or automated methods. For example, the cell-to-cell interconnections may be made using automated soldering and heating methods. The flexible circuit 836 may also be coupled to contact ends 834 and 835 of the series of cells 832 using automated soldering and heating methods, since the contact tabs of the flexible circuit 836 need only to be laid onto contact ends 834 and 835 rather than requiring threading and cutting of multiple bus bar ribbons as in conventional modules. The cells 832 can be sandwiched between EVA sheets 820 and 840, to encapsulate the cells 832. Backing sheet 850, such as a polyvinyl fluoride (PVF) film (e.g., Tedlar®, or Tedlar-polyester-Tedlar), encloses the back side of the assembly 800. A glass sheet 810 covers the front of the assembly, to provide protection from environmental conditions. The entire layered stack may be put in a laminator, where heat and vacuum are applied to laminate the assembly. To complete the module, output connection wires 860 are routed from the flexible circuit 836, through holes 842 and 852 in EVA layer 850 and back sheet 850, respectively, to junction box 870 on the back of the module assembly 800.

Figure 9:
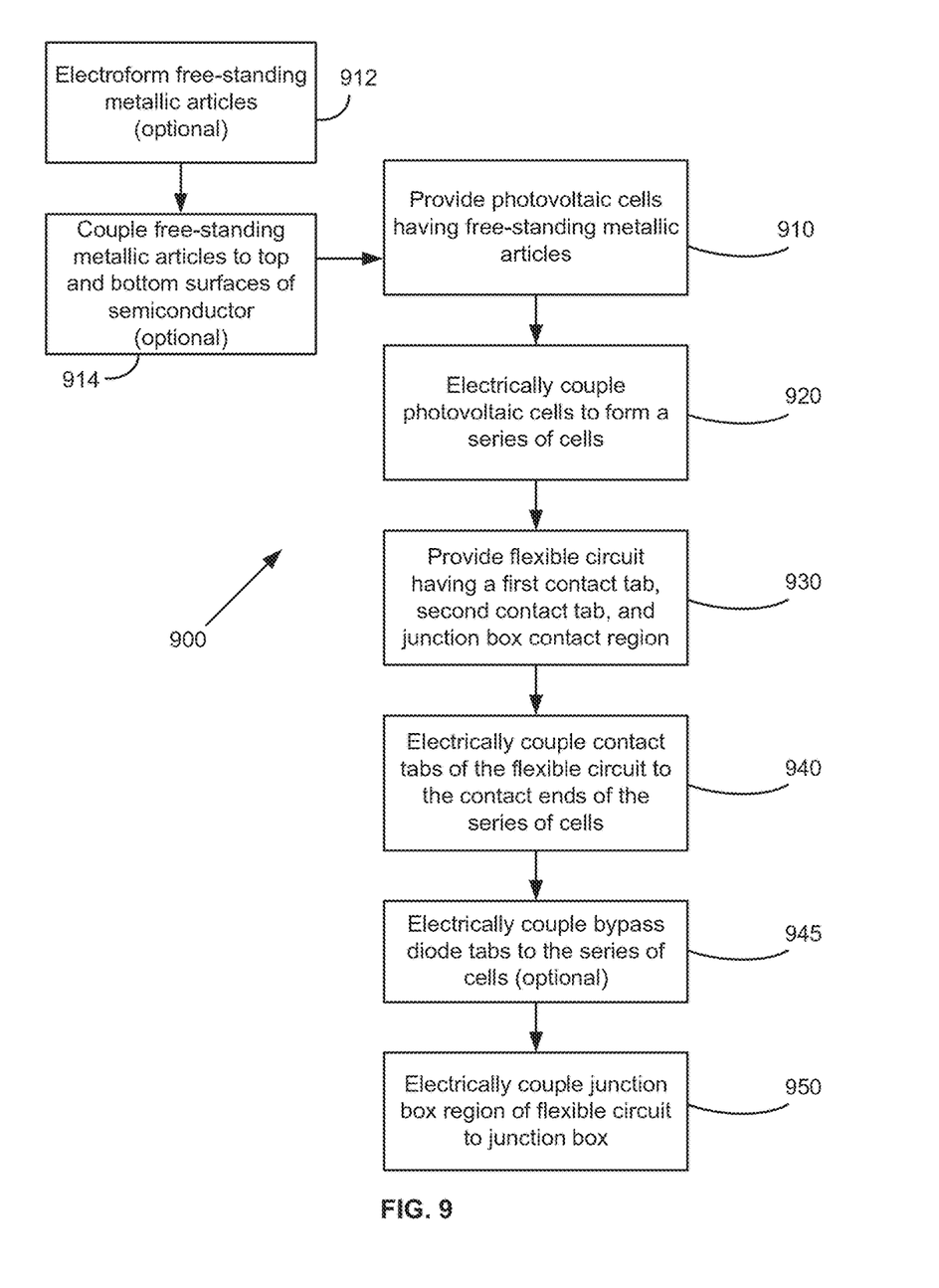
FIG. 9 is a flow chart of an exemplary method for forming photovoltaic modules using flexible circuits of the present disclosure.

FIG. 9 is a flow chart 900 of an exemplary method for manufacturing a solar cell module using a flexible circuit and metallic articles as described above. In other embodiments, conventional ribbon bus bar connections may be used with the flexible circuits disclosed herein. In a step 910, a plurality of photovoltaic cells is provided, each with a free-standing metallic article coupled to a semiconductor substrate material. In some embodiments, the free-standing metallic articles are electroformed on an electrically conductive mandrel in step 912, where the electrically conductive mandrel has a preformed pattern in which at least a portion of the metallic articles are formed, and the metallic articles are separated from the mandrel. Step 910 may also include, in step 914, electrically coupling a first metallic article to the top surface of the semiconductor substrate, and a second metallic article to the bottom surface of the semiconductor substrate. In step 920, the plurality of photovoltaic cells are electrically coupled in series to form a series of cells. The series connection includes electrically coupling a cell interconnection element of each photovoltaic cell to a free-standing metallic article of an adjacent photovoltaic cell. For example, the cell interconnection element may couple the front metallic article to a back metallic article of the neighboring cell. The cell interconnection element of an initial cell in the series of cells serves as a first contact end for the series of cells, and the interconnection element for a final cell in the series cells serves as a second contact end for the series of cells.

In step 930, a flexible circuit comprising a first contact tab, a second contact tab, and a junction box contact region is provided. The flexible circuit may include first and second electrical conduits, which may be fabricated by stamping or electroforming, where the first electrical conduit includes the first contact tab, and the second electrical conduit includes the second contact tab. In some embodiments the flexible circuit may also include a first bypass diode conduit and a second bypass diode conduit, with each diode contact conduit having contact tabs and junction box contact pads. The flexible circuit may also include a support sheet attached to at least a portion of the first and second conduits, as well as the bypass diode conduits. The support sheet may have apertures through the sheet at the first and second junction box contact pads. In step 940 the first contact tab of the flexible circuit is electrically coupled to the first contact end of the series of cells, and the second contact tab of the flexible circuit is electrically coupled to the second contact end of the series of cells. In some embodiments, the bypass diode tabs may be electrically coupled to the series of cells in step 945. In step 950 the junction box region of the flexible circuit is electrically coupled to a junction box, which can include coupling the first and second junction box contact pads to the junction box with, for example, output connection wires. Step 950 may also include electrically coupling a diode to the junction box pads of the bypass diode conduits.

Note that additional steps may be inserted into the method of FIG. 9 to complete the entire module, and the order of steps may be performed in a different order than what is shown. For example, the module assembly process may begin with providing a glass cover panel, and then placing an EVA sheet on the glass. A cell circuit assembly with flexible circuit may be laid onto the first EVA sheet, where the cell circuit assembly may be fabricated in accordance with the steps of flow chart 900. Then a second EVA sheet with punched holes for wire routing may be placed over the cell assembly. The EVA sheets may be laminated onto the cells to encapsulate the photovoltaic cells. A backsheet with punched holes for wire routing is placed over the assembly, and the junction box is attached to finish the module.

Steps 920, 940 and 950 may be automated, such that no manual coupling of components is needed. Automated processes may include, for example, pick and place methods, use of lamination machines, and automated soldering methods. In some embodiments of step 920 the photovoltaic cells may be electrically coupled together by soldering the front interconnect tab to the back contact edge pads, to series connect the cells. In other embodiments, steps 930, 940 and 945 may involve soldering the flexible circuit to a multi-cell circuit cell assembly using automated or manual processes. For an exemplary 60-cell circuit, a flexible circuit tab solders to the back of the first cell from the tab, and another flexible circuit tab solders cell number 60 from the front cell tab to the flex circuit. The additional conduit tabs are soldered to the back of the twentieth cell and the back of the fortieth cell.

It can be seen that the free-standing electroformed metallic article described herein is applicable to various cell types and may be inserted at different points within the manufacturing sequence of a solar cell. Furthermore, the electroformed electrical conduits may be utilized on either the front surface or rear surface of a solar cell, or both. In addition, although the embodiments herein have primarily been described with respect to photovoltaic applications, the methods and devices may also be applied to other semiconductor applications. Furthermore, the flow chart steps may be performed in alternate sequences, and may include additional steps not shown. Although the descriptions have described for full size cells, they may also be applicable to half-size or quarter-size cells. For example, the metallic article design may have a layout to accommodate the cell having only one or two chamfered corners instead of all four corners being chamfered as in a mono-crystalline full pseudosquare.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method of fabricating a photovoltaic module, the method comprising the steps of:
   i) providing a plurality of photovoltaic cells, wherein each cell comprises a first free-standing metallic article electrically coupled to a top surface of a semiconductor substrate and a second free-standing metallic article electrically coupled to a bottom surface of the semiconductor substrate, wherein the first free-standing metallic article of each photovoltaic cell is a unitary piece comprising a plurality of gridlines that are integrally formed with a cell interconnection element;
   ii) electrically coupling the plurality of the photovoltaic cells in series to form a series of cells, wherein the cell interconnection element of each photovoltaic cell is electrically coupled to the second free-standing metallic article of an adjacent photovoltaic cell, and wherein a cell interconnection element of an initial cell in the series of cells serves as a first contact end for the series of cells, and a cell interconnection element for a final cell in the series cells serves as a second contact end for the series of cells;
   iii) providing a flexible circuit comprising:
   a junction box contact region;
   a first electrical conduit comprising a first contact tab and a first junction box contact pad, the first junction box contact pad being in the junction box contact region;
   a second electrical conduit comprising a second contact tab and a second junction box contact pad, the second junction box contact pad being in the junction box contact region; and
   a flexible support sheet, wherein the first and second electrical conduits are mounted on the support sheet in the junction box contact region;
   iv) electrically coupling the first contact tab of the flexible circuit to the first contact end of the series of cells, and the second contact tab of the flexible circuit to the second contact end of the series of cells; and
   v) electrically coupling the junction box contact region of the flexible circuit to a junction box of the photovoltaic module.

2. The method of claim 1, wherein steps (ii), (iv) and (v) are automated processes.

3. The method of claim 1, wherein the cell interconnection element spans substantially an entire edge of the photovoltaic cell.

4. The method of claim 1, wherein the step of providing the plurality of photovoltaic cells comprises:
   a) electroforming a first metallic article on an electrically conductive mandrel, wherein the electrically conductive mandrel has an outer surface comprising a preformed pattern, wherein the preformed pattern has a continuous grid pattern coupled to a cell interconnection pattern, and the preformed pattern has a height and a width with an aspect ratio greater than 0.1, the aspect ratio being the ratio of the height to the width;

b) separating the first metallic article from the electrically conductive mandrel to form the first free-standing metallic article; and c) electrically coupling the first free-standing metallic article to the top surface of the semiconductor substrate.

5. The method of claim 1, wherein the cell interconnection element extends beyond the top surface or the bottom surface of the semiconductor substrate.

6. The method of claim 1, wherein the first junction box contact pad, the second junction box contact pad, the first contact tab and the second contact tab are laterally spaced on the support sheet, and wherein the first junction box contact pad and the second junction box contact pad are between the first contact tab and the second contact tab.

7. The method of claim 1, wherein the first and second electrical conduits are configured to have a total electrical current capacity of 4-40 amperes.

8. The method of claim 1, wherein the step of providing the flexible circuit comprises fabricating the first and second electrical conduits by a process chosen from the group consisting of stamping, electroforming, and etching.

9. The method of claim 1, wherein the first and second contact pads are the only junction points between the series of cells and an output connection of the junction box.

10. The method of claim 1, wherein the support sheet further comprises contact openings through the support sheet at the first and second junction box contact pads.

11. The method of claim 1, wherein the flexible circuit further comprises:

a third electrical conduit having a third contact tab and a third junction box contact pad; and a fourth electrical conduit having a fourth contact tab and a fourth junction box contact pad, wherein the first, second, third, and fourth electrical conduits are side by side with each other.

12. The method of claim 11, wherein the step of electrically coupling the flexible circuit to the series of cells further comprises electrically coupling the third and fourth contact tabs of the flexible circuit to the series of cells.

13. The method of claim 11, wherein the step of electrically coupling the flexible circuit to the series of cells further comprises electrically coupling a diode between a pair of adjacent junction box contact pads.

14. The method of claim 1, wherein the step of electrically coupling the flexible circuit to the series of cells further comprises electrically coupling a diode to the first and second junction box contact pads, wherein the diode is located in the junction box.

15. The method of claim 1, wherein the support sheet is an insulating dielectric layer.

16. The method of claim 1, wherein the first electrical conduit and the second electrical conduit are strips of conductive metal sandwiched between layers of the support sheet.

* * * * *